(12) United States Patent
Kirby et al.

(10) Patent No.: US 8,110,488 B2
(45) Date of Patent: *Feb. 7, 2012

(54) METHOD FOR INCREASING ETCH RATE DURING DEEP SILICON DRY ETCH

(75) Inventors: Kyle Kirby, Eagle, ID (US); Swarnal Borthakur, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 75 days.

This patent is subject to a terminal disclaimer.

(21) Appl. No.: 12/434,882

(22) Filed: May 4, 2009

(65) Prior Publication Data

US 2009/0215263 A1 Aug. 27, 2009

Related U.S. Application Data

(63) Continuation of application No. 11/756,120, filed on May 31, 2007, now Pat. No. 7,544,592.

(51) Int. Cl.
*H01L 21/38* (2006.01)

(52) U.S. Cl. ........ 438/552; 438/427; 438/424; 438/553; 438/555

(58) Field of Classification Search .......... 438/552–555, 438/424–427, 618–624, 637–638, 672–674, 438/700, 706–731
See application file for complete search history.

(56) References Cited

U.S. PATENT DOCUMENTS

| | | | |
|---|---|---|---|
| 5,892,286 A | 4/1999 | Toyoda et al. | |
| 6,043,145 A | 3/2000 | Suzuki et al. | |
| 6,174,449 B1 | 1/2001 | Alwan et al. | |
| 6,194,319 B1 | 2/2001 | Carstensen | |
| 6,206,273 B1 | 3/2001 | Beaman et al. | |
| 6,787,469 B2 | 9/2004 | Houston et al. | |
| 7,235,493 B2 | 6/2007 | Qin | |
| 7,544,592 B2 * | 6/2009 | Kirby et al. | 438/552 |
| 2006/0084262 A1 | 4/2006 | Qin | |
| 2006/0166498 A1 | 7/2006 | Kirby | |

\* cited by examiner

*Primary Examiner* — Dung A. Le
(74) *Attorney, Agent, or Firm* — Wells St. John P.S.

(57) ABSTRACT

A method of increasing etch rate during deep silicon dry etch by altering the geometric shape of the etch mask is presented. By slightly altering the shape of the etch mask, the etch rate is increased in one area where an oval etch mask is used as compared to another areas where different geometrically-shaped etch masks are used even though nearly the same amount of silicon is exposed. Additionally, the depth of the via can be controlled by using different geometrically-shaped etch masks while maintaining virtually the same size in diameter for all the vias.

10 Claims, 2 Drawing Sheets

METHOD FOR INCREASING ETCH RATE DURING DEEP SILICON DRY ETCH

CROSS REFERENCE TO RELATED APPLICATION

This application is a continuation of U.S. patent application Ser. No. 11/756,120 (MIO 0132 PA), filed May 31, 2007.

BACKGROUND OF THE INVENTION

The present invention generally relates to methods of increasing the etch rate of a deep silicon dry etch and, in particular, relates to a method of increasing the etch rate during a deep silicon dry etch by altering the geometric shape of the etch mask.

Conductive passageways, or vias, formed through silicon semiconductor wafers provide a way to transmit power and signals from one side of the silicon semiconductor wafer to the other side. Silicon semiconductors containing vias are used in a variety of technologies, from imaging products and memory to high-speed logic and processing applications. One emerging technology that relies heavily on vias formed through silicon semiconductor wafers is three dimensional (3D) integrated circuit (IC). 3D ICs are created by stacking of thinned semiconductor wafer chips and interconnecting them with through-silicon vias (TSVs). One advantage of using 3D ICs is that memory devices and image sensors can be made without lead frames and substrates, thereby reducing wafer-level packaging costs. Packing costs are estimated to range between fifteen to twenty-five percent of the cost of the finished product. Additionally, single silicon semiconductor wafers can also use vias, for example, to connect ground on one side of the wafer to the other side of the wafer which is connected to a lead frame. Other examples of semiconductor wafer technologies employing the use of vias are DRAM, imagers and Flash memory.

Typically, the etch rate of silicon is directly related to the amount of silicon exposed in an etch mask. However, it can be beneficial to increase the etch rate of some areas of exposed silicon while maintaining the typical etch rate in other areas in order to etch one via deeper than another. Additionally, it could be beneficial to simply increase the overall etch rate of the entire process for increasing production and manufacturability.

Therefore, there is a need to have differing etch rates between different areas of the silicon wafer that have the same amount of exposed silicon in the etch mask.

There is another need to increase the overall etch rate of the exposed silicon over the entire area of the silicon wafer.

There is yet another need to control the depth of the vias that are dry etched in the silicon wafer There is still another need to have vias with virtually the same size diameter have differing depths on a silicon wafer.

BRIEF DESCRIPTION OF THE SEVERAL VIEWS OF THE DRAWINGS

The following detailed description of specific embodiments of the present invention can be best understood when read in conjunction with the following drawings, where like structure is indicated with like reference numerals and in which.

DETAILED DESCRIPTION

In the following detailed description of the embodiments, reference is made to the accompanying drawings that form a part hereof, and in which are shown by way of illustration, and not by way of limitation, specific embodiments in which the invention may be practiced. It is to be understood that other embodiments may be utilized and that logical, mechanical and electrical changes may be made without departing from the spirit and scope of the present invention.

The term 'wafer' is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Further, in the discussion and claims herein, the term 'on' used with respect to two layers, one 'on' the other, means at least some contact between the layers, while 'over' means the layers are in close proximity, but possibly with one or more additional intervening layers such that contact is possible but not required. Neither 'on' nor 'over' implies any directionality as used herein.

Figure 1:
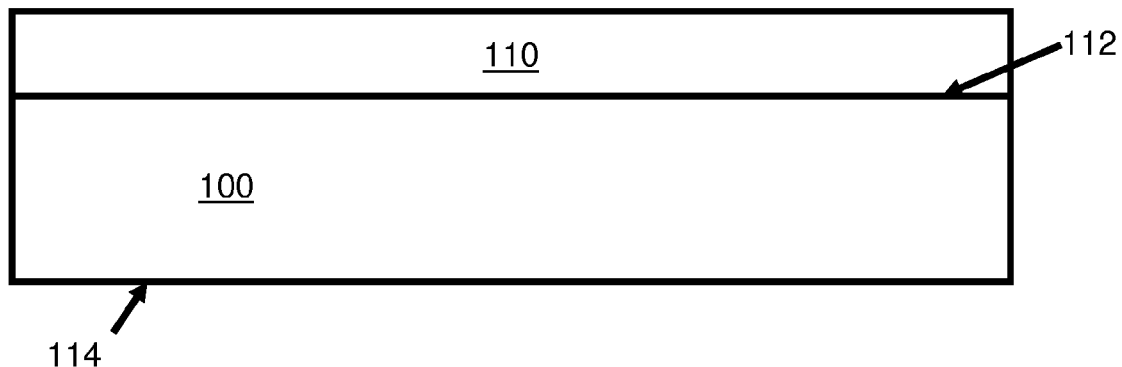
FIG. 1 illustrates a cross section view of via formation according to an embodiment of the present invention.
Figure 2:
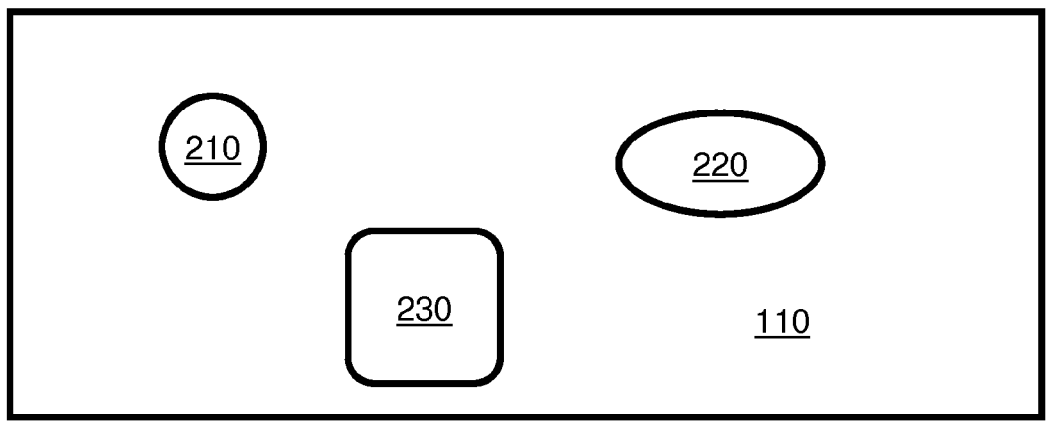
FIG. 2 illustrates an overhead view of an etch mask according to an embodiment of the present invention.

Referring initially to FIG. 1, a silicon wafer substrate 100 is provided. The silicon wafer substrate 100 has a front side 112 and a back side 114. In one embodiment, a patterned etch mask 110 is provided over the front side 112 of the silicon substrate 100. The patterned etch mask 110 can be a photoresist etch mask, a hard-mask of oxide, nitride or any other suitable material, or a combination of a phororesist etch mask and a hard-mask. An overhead view of the patterned etch mask 110 is illustrated in FIG. 2. The patterned etch mask 110 comprises several different geometrically-shaped openings: circle 210, oval 220 and round-cornered square 230. By slightly altering the geometric shape of the openings in the patterned etch mask 110, the overall etch rate can be increased even though nearly the same amount of silicon area is exposed. Each patterned etch mask geometric shape 210, 220, 230 can be precisely designed so that each via opening exposes the same amount of silicon wafer surface area. The amount of exposed silicon per via opening can be, for example, from about 40 µm to about 50 µm in diameter, although smaller exposed areas may be possible depending on the device that is to be produced. Alternatively, the amount of exposed silicon per via opening can be, for example, about 1.5% to about 3% of the open area per silicon wafer. These dimensional ranges are meant to be exemplary only and are not limiting of the present invention.

After the deposition of the patterned etch mask 110, the via openings can be formed in the silicon substrate by dry etching. The dry etching can be plasma etch, reactive ion etching (RIE), magnetically enhanced RIE, inductively coupled plasma (ICP), electron spin resonance, cryogenic silicon etch, or any other suitable method of dry etching. The oval shaped etch mask opening 220 resulted in a deeper via opening over the same period of etching time as compared to the circular-shaped etch mask opening 210 and the rounded-corner square-shaped etch mask opening 230 even though all three etch mask openings 210, 220, 230 had the same amount of silicon exposed. In other words, the oval-shaped etch mask opening 220 etches faster than the circle-shaped 210 or the rounded corner square etch mask 230 openings.

Figure 3:
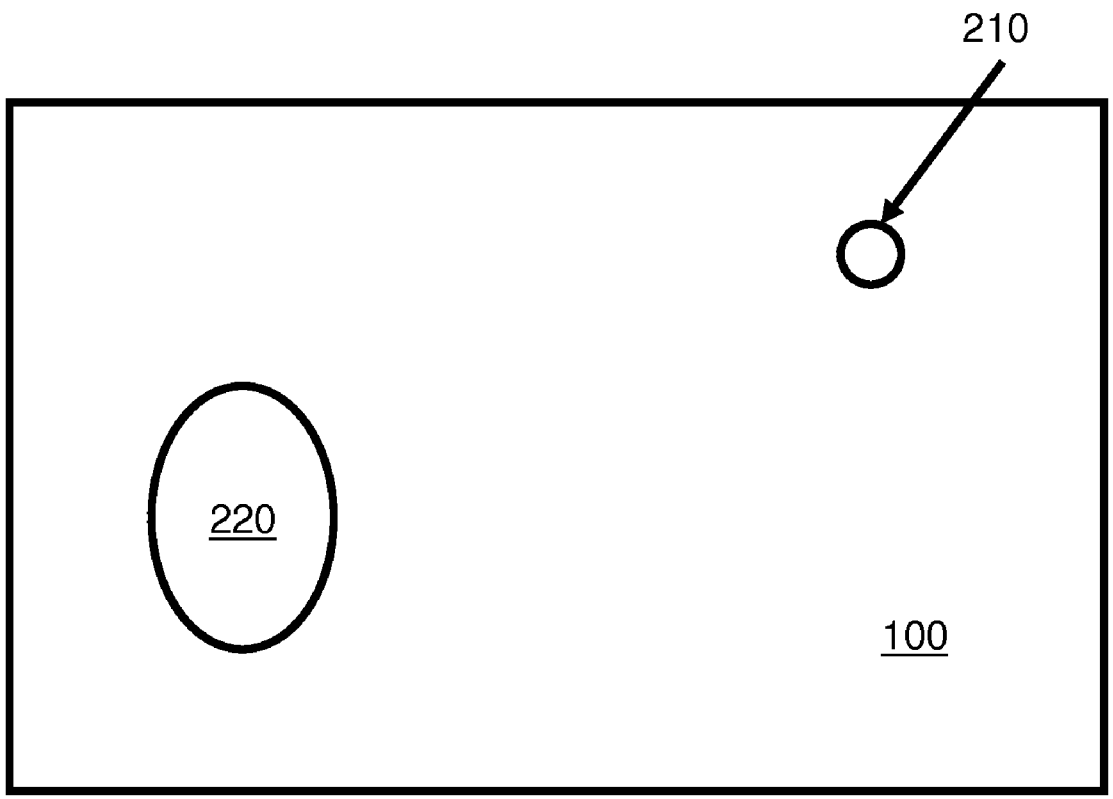
FIG. 3 illustrates the differing etch rates of the different geometric via shapes after backgrinding according to an embodiment of the present invention.

After dry etching, the patterned etch mask 110 is removed. The via openings may been etched through the substrate or etched only partially through the substrate. If the via openings are only partially etched through, backgrinding, or wafer thinning, can be performed to the back side of the silicon substrate. Backgrinding may be performed to create a wafer with the desired thickness as well as to expose the via openings. In another embodiment, the via openings may also be formed by etching the back side 114 of the silicon wafer 100 before or after backgrinding. FIG. 3 illustrates the results of differing geometric etch mask shapes after backgrinding is performed. As illustrated, the oval shaped via openings 220 are exposed before the round via openings 210 during backgrinding. Therefore, the surface area of exposure during backgrinding varies depending on the geometric shape of the via. Additionally, the depth of the via openings also varies depending upon the geometric shape of the via. By altering the geometric shape of the etch mask, the depth of the via openings in one area of the silicon wafer can be different than the another area. The desired depth of the vias is dependent on the type of device, for example, DRAM devices typically have a via depth of about 150 µm whereas imagers strive for a via depth of about 100 µm. These dimensional ranges are meant to be exemplary only and are not limiting of the present invention.

The via openings can then be lined with an insulating or dielectric layer, such as, for example, Low Silane Oxide (LSO), Pulsed Deposition Layer Oxide (PDL), O3-TEOS, or polymer to electrically isolate the silicon wafer from the conductive material to be used to fill the via openings. In one embodiment, a conductive seed layer can then be formed on the insulating or dielectric layer. After the via openings are lined and the conductive seed layer is formed, the via openings can be filled with a conductive material, such as, for example, copper, nickel, palladium, or copper/nickel/palladium and polymer fill. The via openings can also be filled with a combination of conductive and non-conductive material. In another embodiment, the via openings can be filled directly with conductive material after being lined with the insulating or dielectric layer using conductive material deposition techniques known in the art that do not require a conductive seed layer. Other additional layers may be added to the via openings as needed. Any subsequent desired or required wafer processing is then performed as known in the art to process the desired device such as, for example, the connection of signals, power and ground to the conductive material.

By using an oval-shape etch mask, deep silicon etch processes could be optimized for the device production by increasing the overall speed of the dry etch. Additionally, by using different geometrically shaped etch masks over the same silicon wafer, the etch rate in one area can be increased over another area of the same silicon wafer even when all the etch masks have same amount of exposed silicon. Further, vias with virtually the same size of diameter can have varying depths on the same silicon wafer by using the different geometrically-shaped etch masks. Further, the depth of those vias can be controlled by using an etch mask with differing geometrically-shaped etch masks.

It is noted that terms like "preferably," "commonly," and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A method for increasing etch rate during deep silicon dry etch, the method comprising:
   providing a silicon substrate;
   depositing a patterned etch mask with different geometrically shaped openings over the silicon substrate; wherein the different geometrically shaped openings in the patterned etch mask expose the same amount of silicon substrate surface area; and
   forming openings in the silicon substrate within the geometrically shaped openings, wherein the different geometrically shaped openings of the patterned etch mask result in differing rates of silicon etching in the silicon substrate over the same period of time.

2. The method of claim 1 further comprising:
   lining the openings in said silicon substrate with an insulating or dielectric layer; and
   filling the openings with a conductive material after lining the openings with the insulating or dielectric layer.

3. The method of claim 2 including forming a conductive seed layer on said insulating or dielectric layer prior to filling said openings.

4. The method of claim 1 further comprising backgrinding the silicon substrate, wherein the openings formed by the different geometrically shaped openings of the patterned etch mask are exposed at different times by the backgrinding.

5. The method of claim 1 wherein said shapes of said different geometrically shaped openings comprise circles, ovals, and round-cornered squares.

6. The method of claim 1 wherein an oval-shaped geometrically shaped opening results in the deepest openings in said silicon substrate.

7. A method for increasing etch rate during deep silicon dry etch, the method comprising:
   providing a silicon substrate having a front side and a back side;
   depositing a patterned etch mask with different geometrically shaped openings over the front side of the silicon substrate, wherein the different geometrically shaped openings in the patterned etch mask expose the same amount of silicon substrate surface area;
   forming openings in the silicon substrate within the geometrically shaped openings, wherein the different geometrically shaped openings of the patterned etch mask result in differing rates of silicon etching in the silicon substrate over the same period of time; and
   exposing the openings in the silicon substrate by etching the back side of the silicon substrate, wherein the surface area of exposure of the openings depends on the geometrical shape of the openings.

8. The method of claim 7, wherein an oval-shaped geometrically shaped opening results in the deepest openings in said silicon substrate.

9. The method of claim 1, wherein the patterned etch mask comprises a patterned photoresist etch mask, a patterned hard-mask, or combination thereof.

10. The method of claim 7, wherein the patterned etch mask comprises a patterned photoresist etch mask, a patterned hard-mask, or combination thereof.

* * * * *